United States Patent
Won

Patent Number: 6,075,747
Date of Patent: Jun. 13, 2000

[54] METHOD OF CONTROLLING A ROW ADDRESS STROBE PATH

[75] Inventor: Jang Kyu Won, Kyungki-Do, Rep. of Korea

[73] Assignee: Hyundai Electronics Industries Co., Ltd., Kyungki-Do, Rep. of Korea

[21] Appl. No.: 09/342,177

[22] Filed: Jun. 29, 1999

[30] Foreign Application Priority Data

Jun. 29, 1998 [KR] Rep. of Korea .................... 98-24842

[51] Int. Cl.⁷ .................................................. G11C 8/00
[52] U.S. Cl. ........................... 365/230.06; 365/230.08
[58] Field of Search ....................... 365/230.06, 189.05, 365/189.01, 203.08, 222

[56] References Cited

U.S. PATENT DOCUMENTS

| | | | |
|---|---|---|---|
| 5,222,042 | 6/1993 | Ichiguchi | 365/190.01 |
| 5,446,695 | 8/1995 | Douse et al. | 365/222 |
| 5,771,199 | 6/1998 | Lee | 365/230.03 |
| 5,838,990 | 11/1998 | Park et al. | 395/834 |
| 5,841,705 | 11/1998 | Hamamoto et al. | 365/189.09 |
| 5,844,857 | 12/1998 | Son et al. | 365/230.06 |

FOREIGN PATENT DOCUMENTS

| | | |
|---|---|---|
| 6-290586 | 10/1994 | Japan . |
| 7-320482 | 12/1995 | Japan . |
| 8-221999 | 8/1996 | Japan . |
| 8-315570 | 11/1996 | Japan . |
| 9-293374 | 11/1997 | Japan . |

*Primary Examiner*—David Nelms
*Assistant Examiner*—David Lam
*Attorney, Agent, or Firm*—Pennie & Edmonds LLP

[57] ABSTRACT

The present invention provides a method of controlling a row address strobe path which can prevent an interference of a row address signal generated at the time of falling of a word line boosting signal at a row decoder by using a plurality of row address strobe signal having different disable time. The present invention reduces the overlap of signals which can be caused at the time of charging/discharging the word line of memory device by preventing the interference of row address at the time of falling of word line boosting signal which can be generated at the row decoder by controlling a word line boosting signal provided to a row decoder by using a first RAS signal outputted from a RAS buffer; and generating a second RAS signal by receiving and logically operating said first RAS signal and a signal delayed by a predetermined time by feeding back said first RAS signal, and controlling a row address signal provided to said row decoder by using said generated second RAS signal.

1 Claim, 4 Drawing Sheets

METHOD OF CONTROLLING A ROW ADDRESS STROBE PATH

BACKGROUND OF THE INVENTION

1. Field of the Invention

The present invention relates to a method of controlling a row address strobe path and, more particularly, to a method of controlling a row address strobe path which can prevent a signal interference to a word line boosting signal at the time of enabling a word line

2. Related Prior Art

In general, in a conventional row address path as shown in FIG. 1, a RAS signal RAS1B outputted from a RAS buffer 10 is inputted to a predecoder 14 through an address controller 12, the predecoder 14 generates a plurality of row address signals AX01, AX23, AX45 and AX67 and outputs them to subsequent blocks, the row address signal AX01 among them is provided to the directly rear word line enable block 16, and the remaining row address signals AX23, AX45 and AX are provided to a row decoder (X-DEC) 20.

The RAS signal RAS1B outputted from the RAS buffer 10 is inputted into the word line enable block 16 and is used in word line enable control operation as shown in FIG. 2, the signal WL-EN outputted from the word line enable blocks 16 is applied to a word line boosting signal generator 18 so as to generate a word line boosting signal PX (refer to FIG. 2), and the word line boosting signal PX generated from the word line boosting signal generator 18 drives a word line WL decoded by the row address signal AX23, AX45 and AX67 inputted to the row decoder (refer to FIG.2).

In the conventional row address strobe path, both of the row address signal for example AX23 and the word line boosting signal PX are controlled by a RAS signal RAS1B.

In the conventional row decoder shown in FIG. 3, the word line WL is charged/discharged by the word line boosting signal PX which is controlled through a PMOS transistor P1 which is turned on/off by the row address signal AX23.

Therefore, if the row address signal AX23 falls, a first node N1 becomes logically high H, a second node N2 becomes logically low L, and a third node N3 becomes logically high H so as to turn off the PMOS transistor P1 so as to interrupt the path between the word line boosting signal PX and word line WL.

However, since the falling down of the word line boosting signal PX is slower than the row address signal AX23, the PMOS transistor P1 is turned off while the word line boosting signal PX is not discharged to logically low.

SUMMARY OF THE INVENTION

Therefore, an object of the present invention is to provide a method of controlling a row address strobe path which can prevent an interference of a row address signal generated at the time of falling of a word line boosting signal at a row decoder by using a plurality of row address strobe signal having different disable time to solve the above described prior art problems.

A method of controlling a row address strobe path according to an embodiment of the present invention to accomplish the above described object is characterized in that it comprises the steps of: controlling a word line boosting signal provided to a row decoder by using a first RAS signal outputted from a RAS buffer; and generating a second RAS signal by receiving and logically operating said first RAS signal and a signal delayed by a predetermined time by feeding back said first RAS signal, and controlling a row address signal provided to said row decoder by using said generated second RAS signal; and wherein said row address signal is disabled later than said word line boosting signal.

BRIEF DESCRIPTION OF THE DRAWINGS

The above object and other advantages of the present invention will become more apparent by describing in detail the preferred embodiment of the present invention with reference to the attached drawings in which.

Similar reference characters refer to similar parts in the several views of the drawings.

DETAILED DESCRIPTION OF THE INVENTION

An embodiment of the present invention will be described in detail below with reference to the accompanying drawings.

Figure 1:
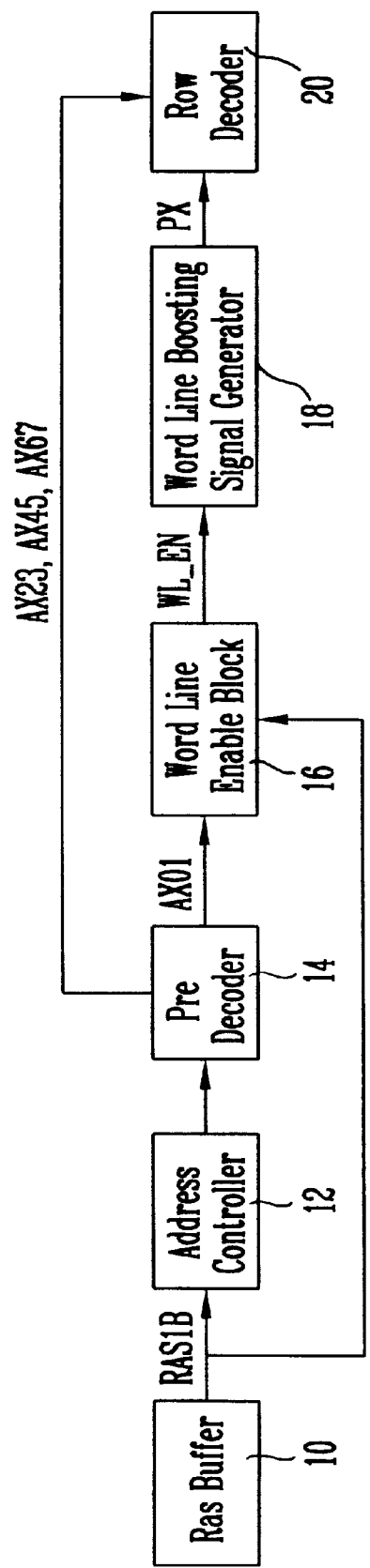
FIG. 1 is a block diagram to illustrate a conventional row address strobe signal path.
Figure 2:
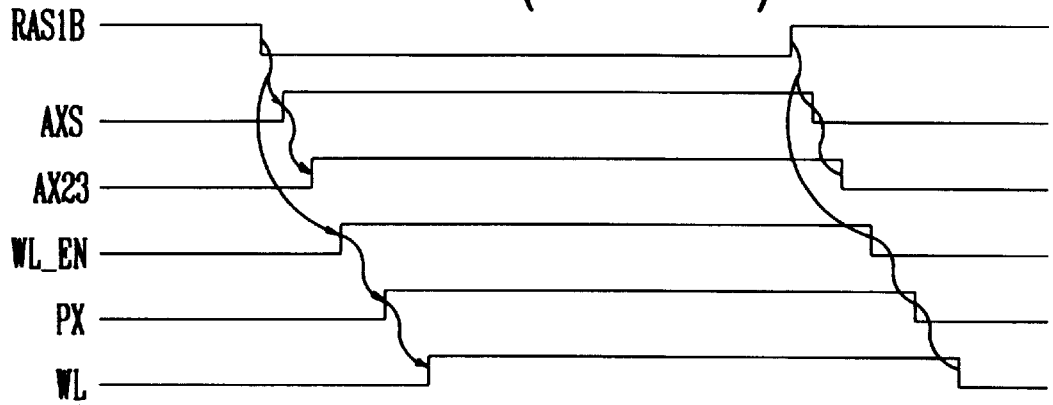
FIG. 2 is a signal timing diagram of each part shown in FIG. 1.
Figure 3:
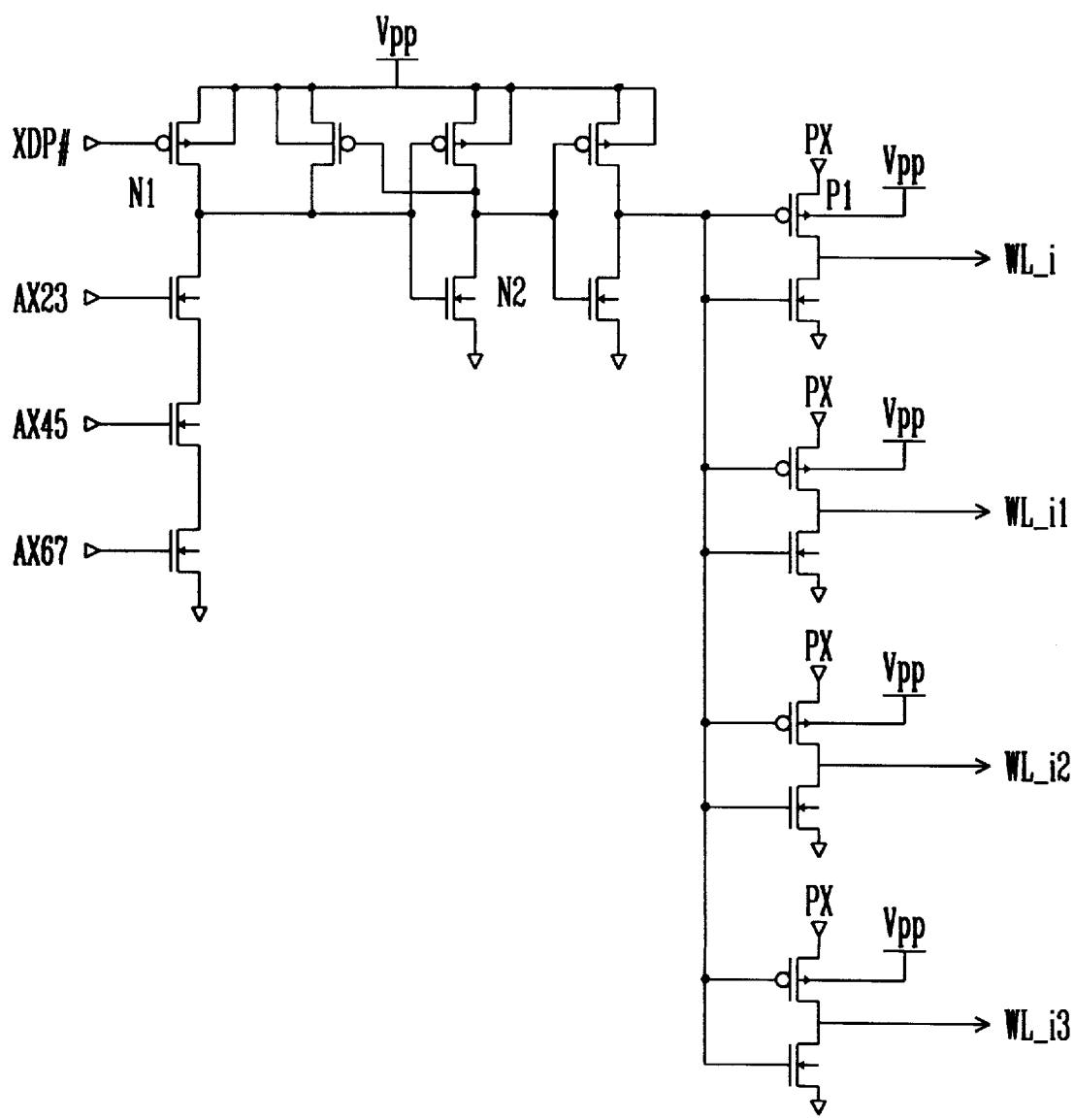
FIG. 3 is an internal circuit diagram of a row decoder shown in FIG. 1.
Figure 4:
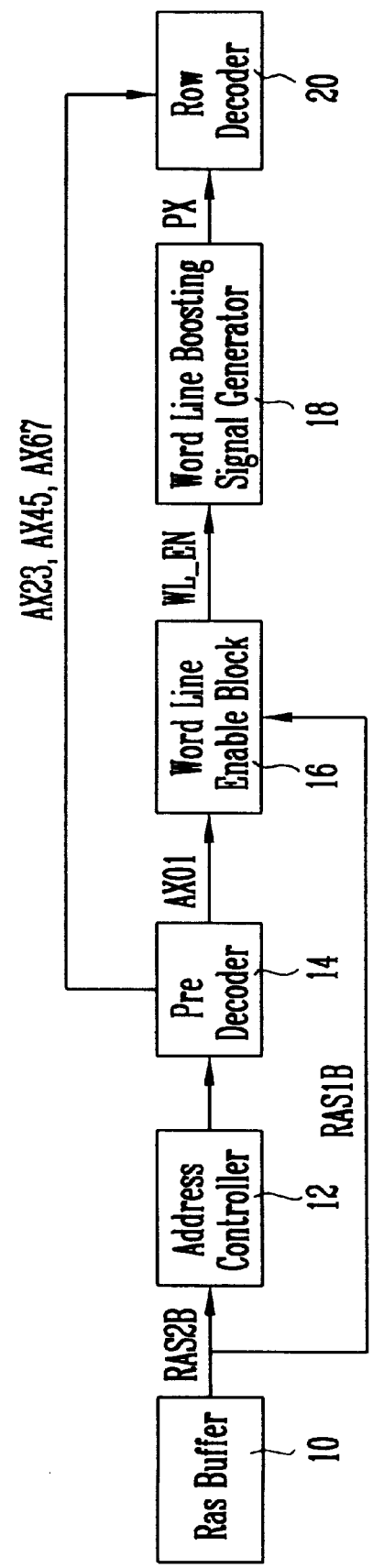
FIG. 4 is a block diagram to illustrate a row address strobe signal path according to the present invention.

FIG. 4 is a block diagram to illustrate a row address strobe signal path according to the present invention, which employs the constitutional elements illustrated in FIG. 1 as they are, with the differences in that although in FIG. 1 the RAS buffer 10 applies the RAS signal RAS1B (hereinbelow referred to as a first RAS signal) to the address controller 12 and word line enable block 16, in FIG. 4 the RAS buffer 10 outputs the first RAS signal RAS1B and second RAS signal RAS2B, the first RAS signal RAS1B is applied to the word line enable block 16 and the second RAS signal RAS2B is applied to the address controller 12.

Figure 5:
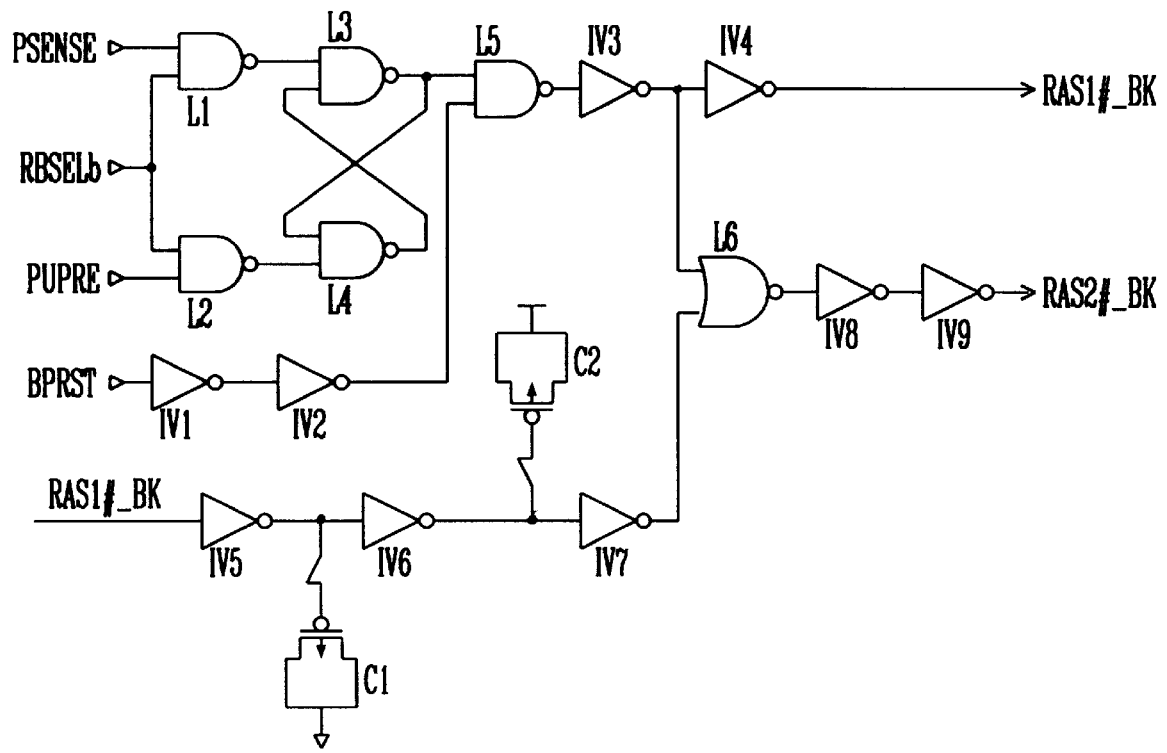
FIG. 5 is a circuit diagram of a generator of a first and second row address strobe signals shown in FIG. 4.

In addition, the second RAS signal RAS2B is characterized in that it has a disable interval longer than that of the first RAS signal RAS1B by a predetermined time (for example, td; refer to FIG. 6), and the first and second signals RAS1B and RAS2B outputted from the RAS buffer 10 are generated by a circuit shown in FIG. 5.

The first RAS signal RAS1B, RAS1#_BK generator circuit shown in FIG. 5 comprises a NAND gate L1 which receives a first pulse signal PSENSE and a row bank selection signal RBSELB and NAND-processes them, a NAND gate L2 which receives the row bank selection signal RBSELB and a second pulse signal PUPRE and NAND-processes them, a NAND gate type latch L3 and L4 for which an initial value is established by a third pulse signal BPRST through inverters IV1, IV2 and which latches output signal of the NAND gates L1 and L2, a NAND gate L5 which receives output signal of the latch and NAND-processes them, and a plurality of inverters IV3 and IV4 for delaying the output signal of the NAND gate L5, thereby generating the first RAS signal RAS1B.

The first pulse signal PSENSE is a pulse signal generated by a signal rising from a RAMbus DRAM interface toward a core and enables the RAS signal, that is, makes the RAS signal RAS1B from high level H to low level L.

The row bank selection signal RBSELb is a signal for selecting one of two banks and at high level or low level.

The second pulse signal PUPRE is a pulse signal generated at prech signal and disables the RAS signal, that is, makes the RAS signal RAS1b from low level to high level.

The third pulse signal is at low level for a certain time after the power (source) is on, and is set to a high level when the power is completely raised, and thereafter, maintains high level until the power is off so as to establish the inital value of the NAND gate type latch (composed of L3 and L4).

The second RAS signal RAS2B, RAS2#_BK generator circuit comprises delay elements IV5, IV6, IV7, C1 and C2 for delaying the first RAS signal RAS1B, RAS1#_BK during a predetermined number of time constant a NOR gate L6 which receives a signal having passed the delay elements and signals between the inverters IV3 and IV4 and NOR-processes them, and a plurality of inverters IV8 and IV9 for delaying an output signal of the NOR gate L6, thereby generating the second RAS signal RAS2B.

The method of controlling the row address strobe path according to an embodiment of the present invention is described below with reference to a signal timing diagram of FIG. 6.

The first RAS signal RAS1B generated at a RAS buffer 10 is applied to a word line enable block 16 and disables the word line enable signal WL-EN which is input to a word line boosting signal generator 18 to control the rising and falling of the word line boosting signal PX which is input to a row decoder 20 to drive the word line WL.

On the other hand, the second RAS signal RAS2B which is a signal falling with a delay of predetermined time td in comparison with the frirst RAS signal RAS1B is output from the RAS buffer 10 and controls the row address signal AX23, which is a predecoding signal of address, through an address controller 12 and a predecoder 14, and the row address signal AX23 is input to the row decoder 20 together with other row address signals AX45 and AX67, and the row address signal AX23 controls the row decoder 20.

That is, the first RAS signal RAS1B controls the word line boosting signal PX, and the second RAS signal RAS2B controls the row address signal AX23.

Figure 6:
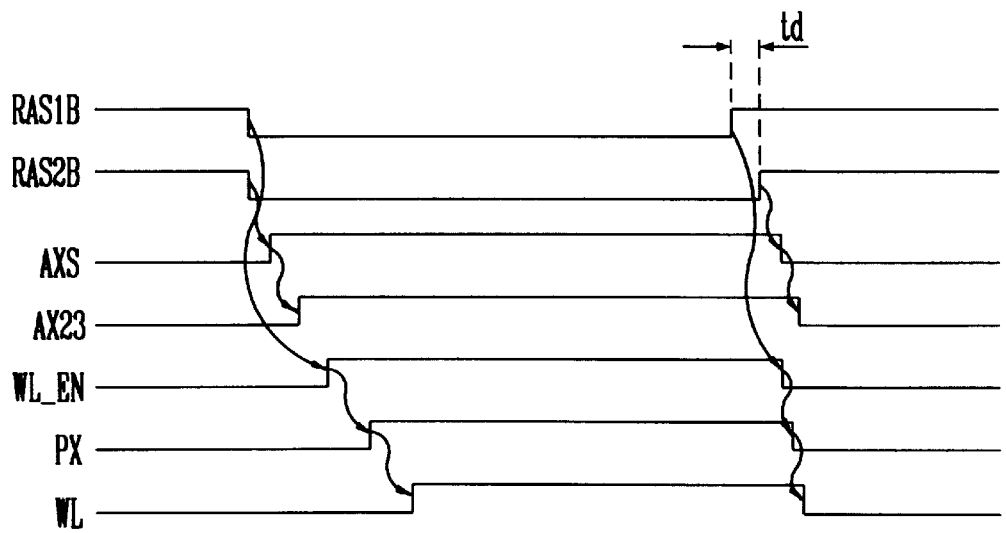
FIG. 6 is a signal timing diagram of each part shown in FIG. 4.

Therefore, as shown in FIG. 6, since there is time delay of predetermined time td between the first RAS signal RAS1B and second RAS signal RAS2B, the row address signal AX23 can not interfere the falling of the word line boosting signal PX at the row decoder 20.

As described above, according to the present invention, since the interference of row address at the time of falling of word line boosting signal which can be generated at the row decoder is prevented, the overlap of signals which can be caused at the time of charging/discharging the word line of memory device is reduced.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention

What is claimed is:

1. A method of controlling a row address strobe path comprising the steps of:

controlling a word line boosting signal provided to a row decoder by using a first RAS signal outputted from a RAS buffer; and generating a second RAS signal by receiving and logically operating said first RAS signal and a signal delayed by a predetermined time by feeding back said first RAS signal, and controlling a row address signal provided to said row decoder by using said generated second RAS signal; and wherein said row address signal is disabled later than said word line boosting signal.

* * * * *